United States Patent [19]

Yamazaki

[11] Patent Number: 5,600,177
[45] Date of Patent: Feb. 4, 1997

[54] SEMICONDUCTOR DEVICE HAVING AN ELECTRICALLY CONDUCTIVE LAYER INCLUDING A POLYCRYSTALLINE LAYER CONTAINING AN IMPURITY AND A METALLIC SILICIDE LAYER

[75] Inventor: Toru Yamazaki, Tokyo, Japan

[73] Assignee: NEC Corporation, Tokyo, Japan

[21] Appl. No.: 358,456

[22] Filed: Dec. 19, 1994

[30] Foreign Application Priority Data

Dec. 28, 1993 [JP] Japan .................................. 5-337686

[51] Int. Cl.$^6$ .......................... H01L 27/082; H01L 29/76; H01L 23/48; H01L 27/088
[52] U.S. Cl. .......................... 257/588; 257/413; 257/755; 257/900; 427/579
[58] Field of Search ...................... 257/588, 587, 257/592, 413, 412, 755, 408, 900; 427/45.1

[56] References Cited

U.S. PATENT DOCUMENTS 4,990,365  2/1991  Treichel et al. ..................... 427/45.1
5,121,184  6/1992  Huang et al. ......................... 257/588

FOREIGN PATENT DOCUMENTS 1-214168  8/1989  Japan ................................... 257/413
4-150037  5/1992  Japan ................................... 257/588

OTHER PUBLICATIONS

Fujii, Toyokazu et al., "Dual (n /p ) Polycide Interconnect Technology using poly–Si/WSi2/Poly–Si Structure and Post B Implantation", *IEEE*, 1992, pp. 845–848.

*Primary Examiner*—Steven H. Loke
*Attorney, Agent, or Firm*— Young & Thompson

[57] ABSTRACT

The upper and lateral surfaces of a polycide electrode comprising a P$^+$-type polycrystalline silicon layer 6 and a tungsten silicide layer 13 are covered with silicon nitride films 9, 9A. Reduction of the boron concentration at the interface between the lower polycrystalline silicon layer and the upper tungsten silicide layer is suppressed.

15 Claims, 5 Drawing Sheets

SEMICONDUCTOR DEVICE HAVING AN ELECTRICALLY CONDUCTIVE LAYER INCLUDING A POLYCRYSTALLINE LAYER CONTAINING AN IMPURITY AND A METALLIC SILICIDE LAYER

FIELD OF THE INVENTION

The present invention relates to a semiconductor device and, in particular, to a semiconductor device having an electrically conductive layer or electrode line effective in applying to a bipolar transistor, MOS transistor, etc. which allows high speed operation.

BACKGROUND OF THE INVENTION

In order to achieve a high speed switching in the bipolar transistor, it is necessary to improve the maximum oscillating frequency (hereinafter abbreviated as $f_{max}$) which is one of the characteristics of the transistor. The value of $f_{max}$ is given according to the following formula:

$$f_{max} = [f_T/(8\pi R_B C_{BC})]^{0.5}$$

Here, $f_T$ denotes cut-off frequency, $R_B$ base resistance, and $C_{BC}$ base-collector capacitance. In order to improve $f_{max}$, as obvious from the foregoing formula, it is necessary to make the cut-off frequency $f_T$ higher, make the base-collector capacitance $C_{BC}$ smaller and to reduce the base resistance $R_B$.

Conventionally, in order to improve the cut-off frequency $f_T$, the depth of the junction, in particular the depth of base layer, taken in the longitudinal direction has been made shallower by reconsidering the heat treatment and ion implantation conditions.

Further, in order to reduce a base-collector capacitance and the base resistance, as shown in FIG. 1, the device dimension taken in the horizontal direction has been reduced by utilizing a self-aligning aligning type structure which comprises an emitter diffusion layer 12 formed in self-aligning manner relative to a base electrode comprising a polycrystalline silicon layer 6A. Incidentally, in the same figure, reference numeral 1 denotes a silicon substrate, 2 a buried layer, 3 an epitaxial layer, 4 a field oxide film, 10 a silicon oxide film, 10A a side wall comprising a silicon oxide film, 12 an emitter diffusion layer, 8a base diffusion layer, 5 a collector diffusion layer, 7 an external base diffusion layer, 11 a highly doped $N^+$-type polycrystalline silicon layer, and 6A a highly doped $P^+$-type polycrystalline silicon layer.

In recent years, in order to improve $f_{max}$ of the bipolar transistor, a further reduction of the base resistance becomes necessary, and it has been proposed to use a silicide or polycide for the base electrode. However, if a high temperature heat treatment is conducted with a silicide layer made of, for example, tungsten silicide contacting the polycrystalline silicon layer containing highly doped boron, then boron within the polycrystalline silicon layer diffuses into the silicide layer, and the boron concentration within the polycrystalline silicon layer in the neighborhood of the interface between the silicide layer and the polycrystalline silicon layer is decreased. As a result, junction between the silicide layer and the polycrystalline silicon layer results in a Schottky junction and the contact resistance is increased. This is also the case with the gate electrode of the MOSFET.

In order to solve the foregoing problems, a method has been proposed in which boron is introduced with a high concentration by ion implantation process or the like into not only the polycrystalline silicon layer, which is the lower layer, but also into the silicide layer, which is the upper layer, so that the diffusion of the boron within the polycrystalline silicon layer into the silicide layer is suppressed even if heat treatment is conducted. However, in this method, if the heat treatment temperature is above 850 degrees Centigrade and the treatment time is prolonged over, for example, 30 min and above, then the contact resistance is increased, and the method can be applied only under the limited manufacturing conditions.

Further, other than the foregoing ion implantation process, as described in Japanese Patent Application Laid-Open No. 4-150037, a method of forming a silicon oxide film (BSG) containing boron on the surface of the silicide layer at the low temperature of about 450 degrees Centigrade is also proposed.

Further, as described in International Electron Devices Meeting, pp 845 through 848, 1992, by T. Fujii, a method has been also proposed in which, after the polycrystalline silicon layer is formed on the surface of the silicide layer, a silicon oxide film is formed on the polycrystalline silicon layer to prevent boron contained within the lower polycrystalline silicon layer from diffusing into the silicide layer in the subsequent heat treatment process for redistribution. This is based on the following reasons.

That is, segregation of boron at the interface between the oxide film and the tungsten silicide layer is caused because the B-0 phase is ready to form at the interface. Therefore, if, instead of forming the oxide film on the tungsten silicide layer directly, the polycrystalline silicon layer is inserted between both of them, then formation of the B-0 phase is suppressed, sucking out of the boron from the polycrystalline silicon layer below the tungsten silicide layer becomes small, and the boron concentration at the interface between the tungsten silicide layer and the polycrystalline silicon layer can be maintained high. It is hereinafter described with reference to FIGS. 2A through 2C.

First, as shown in FIG. 2A, an $N^+$-type buried layer 2 and an N-type epitaxial layer 3 are sequentially formed on a P-type silicon substrate 1.

Next, a field oxide film 4 having a thickness of 300 through 600 nm is selectively formed. By utilizing the ion implantation process, a collector diffusion layer 5 is formed so as to reach the $N^+$-type buried layer 2. Next, after the oxide film lying on an active base area is removed according to the photoetching process, a 100 through 300 nm thick $P^+$-type polycrystalline silicon layer 6 containing boron is grown. Introduction of boron into the polycrystalline silicon layer is conducted according to, for example, the ion implantation process under the implantation conditions of energy of 5 through 10 KeV and $5 \times 10^{15}$ through $1 \times 10^{16}$ cm$^{-2}$. Incidentally, boron may be introduced while the polycrystalline silicon layer is being formed.

Next, a metallic silicide layer, for example a tungsten silicide layer 13, is formed to a thickness of 100 to 200 nm by utilizing a known sputtering process. Incidentally, boron may be introduced into the tungsten silicide layer 13 by utilizing the ion implantation process. Next, the polycrystalline silicon layer 14A is formed to a thickness of 20 to 80 nm. Next, a silicon oxide film 10 is formed to a thickness of 100 to 200 nm by utilizing the LPCVD process. Next, these are patterned to a predetermined form to form a base lead electrode comprising polycrystalline silicon layers 6, 14A and tungsten silicide layer 13. Next, a polycrystalline silicon layer 14B is grown to a thickness of 20 to 80 nm. Next, the surface of the substrate is dry etched to leave the polycrystalline silicon layer 14B on the lateral surface of the base lead electrode, as shown in FIG. 2B.

Next, as shown in FIG. 2C, boron ions are implanted into the active base area under the condition of 10 keV and $5 \times 10^{13}$ cm$^{-2}$ to form a base diffusion layer 8. Next, a side wall 10A comprising a silicon oxide film having a thickness of 100 to 300 nm is formed on the lateral surface of the base lead electrode according to a known technique. As a result, the tungsten polycide base lead electrode is covered in its upper and lateral surfaces with the oxide film.

Next, an N$^+$-type polycrystalline silicon layer 11 containing an N-type impurity, for example arsenic, is deposited to a thickness of 200 to 300 nm to form an emitter lead electrode. Next, an emitter diffusion layer 12 is formed by heat treatment in the atmosphere of nitrogen at 900 to 950 degrees Centigrade for 10 min. Thereafter, although not shown, an interlayer insulating film and electrodes are formed as well known to complete a bipolar transistor.

In the foregoing method of forming the silicon oxide film (BSG) containing the boron on the surface of the silicide layer, in order to prevent occurrence of the increase of contact resistance between the silicide layer and the polycrystalline silicon layer by heat treatment, the boron concentration of at least 10 mol % is necessary within BSG film. However, if the BSG film of this concentration is applied to the surface of the silicide layer, then the boron within the BSG film is diffused into the polycrystalline silicon layer 11 adapted for forming the emitter due to the heat treatment in the subsequent process such as an emitter forming process, and the increase of the emitter resistance or an insufficient emitter junction result.

On the other hand, when the foregoing method in which the polycrystalline silicon layer and the silicon oxide film are formed on the silicide layer as shown in FIGS. 2A to 2C, if the bipolar transistor is formed, the following problems arise.

If the tungsten polycide electrode is used to the base lead electrode of the bipolar transistor, in order to suppress the segregation of boron at the interface of the sidewall 10A, it is necessary to provide the polycrystalline silicon layer 14B not only on the upper surface of the electrode but also on the lateral surface of the electrode. However, this not only incurs the increase of the manufacturing process, but also, as obvious from the cross-sectional view of FIG. 2C, the distance between the polycrystalline silicon layer 14B on the lateral surface of the base electrode and the polycrystalline silicon layer 11 of the emitter electrode come near and, as shown by arrow X, both electrodes become easy to short causing a great reduction of the yield. Further, since the polycrystalline silicon film is left on the lateral surface of the base electrode, as shown in FIGS. 2A and 2B, after the polycrystalline silicon layer 14B is grown, the entire surface thereof is etched back by dry etching. At this time, since the selection ratio of the etching between the polycrystalline silicon layer 14B and the silicon substrate is nearly equal to 1, etching cannot be stopped at the interface between the polycrystalline silicon layer 14B and the epitaxial layer 3, reaching up to the latter 3. As a result, defects are introduced into the silicon substrate at the emitter forming area, causing junction leakage, or as shown by arrow Y, if the amount by which the silicon substrate is dug is great, then a link base area below the sidewall 10A is not sufficiently formed, and the base resistance is increased to degrade the high speed switching characteristic of the transistor greatly.

SUMMARY OF THE INVENTION

An object of the present invention is to suppress the reduction of the boron concentration at the interface between the polycrystalline silicon layer and the metallic silicide layer in the semiconductor device.

The present invention provides a semiconductor device having an electrically conductive layer comprising a polycrystalline silicon layer containing an impurity and a metallic silicide layer which are sequentially formed on a semiconductor substrate or on an insulating film formed on the semiconductor substrate, the upper and lateral surfaces of the electrically conductive layer being covered with a nitride film.

The nitride film may contain the same impurity as that of the polycrystalline silicon layer. The metallic silicide layer may contain the same impurity as that of the polycrystalline silicon layer.

The semiconductor substrate may be made of silicon. The insulating film may be made of silicon oxide. The impurity may be boron. The metallic silicide layer may be made of tungsten silicide, molybdenum silicide, titanium silicide, cobalt silicide, platinum silicide or tantalum silicide.

The electrically conductive layer may be a base lead electrode of a bipolar transistor or a gate electrode of a MOSFET.

According to the present invention, in the bipolar transistor having the base lead electrode of polycide structure, the reduction of the boron concentration at the interface between the lower polycrystalline silicon layer and the upper metallic silicide layer can be suppressed by covering the upper surface of the base electrode and the lateral surface of the electrode with the nitride film or the same containing boron, and the increase of the base resistance can be prevented and the bipolar transistor of a high speed switching can be realized. Further, if the present invention is applied to the MOSFET, depletion of the gate electrode can be prevented, and an excellent MOS transistor characteristics can be obtained.

DESCRIPTION OF THE PREFERRED EMBODIMENTS

Next, the present invention is described with reference to the accompanying drawings.

Figure 3:
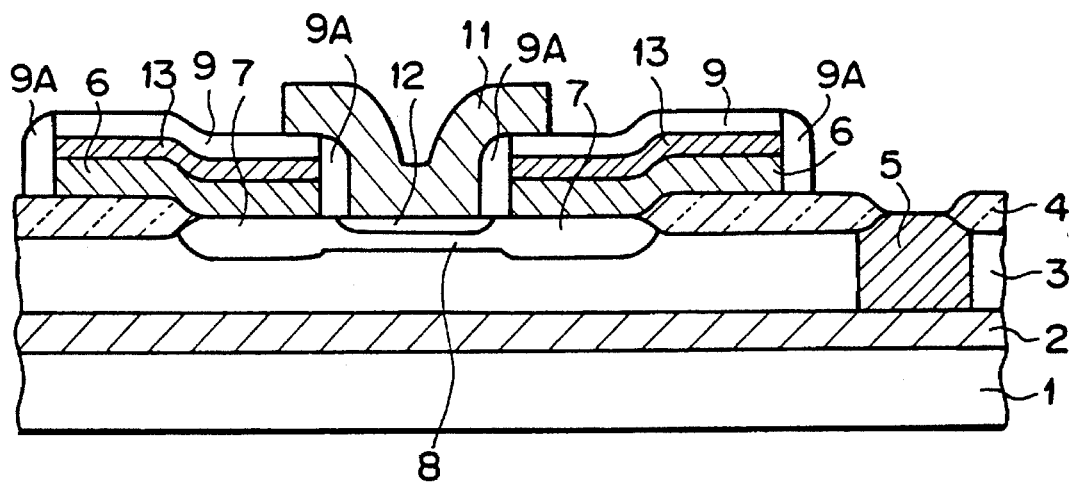
FIG. 3 is a cross-sectional view of a first embodiment of a semiconductor device according to the present invention.

FIG. 3 is a cross-sectional view illustrating a first embodiment of the present invention. In the same figure, an $N^+$-type buried layer 2 and an N-type epitaxial layer 3 are sequentially formed on a P-type silicon substrate 1. On the surface of the N-type epitaxial layer 3, a field oxide film 4 for element separation is selectively formed. Further, at a predetermined area of the N-type epitaxial layer 3, a collector diffusion layer 5 is formed so as to reach the $N^+$-type buried layer 2. On the other hand, at another predetermined area of the N-type epitaxial layer 3, a base diffusion layer 8 is formed and an emitter diffusion layer 12 is further formed therein. At both sides of the base diffusion layer 8, an external base diffusion layer 7 is formed at the surface portion of the N-type epitaxial layer 3. A base lead electrode or base electrode comprising a $P^+$-type polycrystalline silicon layer 6 and a tungsten silicide layer 13, which is connected to the base diffusion layer 8, is formed above the external base diffusion layer 7. Further, a silicon nitride film 9 and a silicon nitride sidewall 9A are formed so as to cover the base lead electrode (6,13) to form an interlayer insulating film, and an emitter lead electrode or emitter electrode of the $N^+$-type polycrystalline silicon layer 11 connected to the emitter diffusion layer 12 is formed.

Figure 4A:
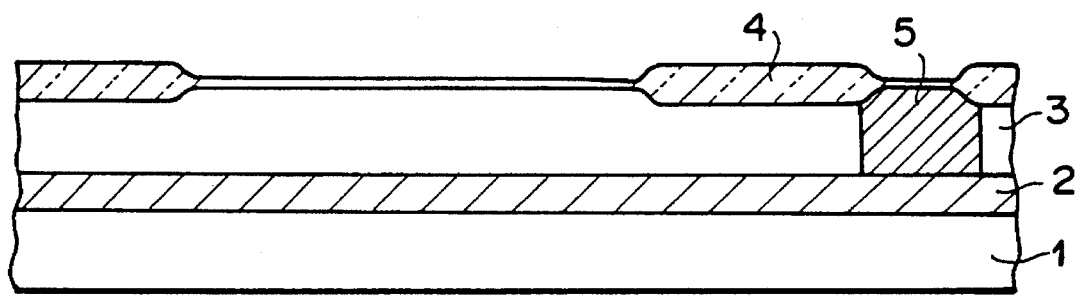
FIGS. 4A and 4B are respectively a cross-sectional view of the semiconductor device for explaining the manufacturing method of the first embodiment of the present invention.

Next, the manufacturing method of the first embodiment is described with reference to FIGS. 3. 4A and 4B. First, as shown in FIG. 4A. the $N^+$-type buried layer 2 and the N-type epitaxial layer 3 are sequentially formed over the entire surface of the P-type semiconductor substrate 1. Next, by utilizing a known selective oxidization process, the field oxide film 4 for element separation having a thickness of 300 to 600 nm is selectively formed. By utilizing the ion implantation process, the collector diffusion layer is formed so as to reach the $N^+$-type buried layer 2.

Figure 4B:
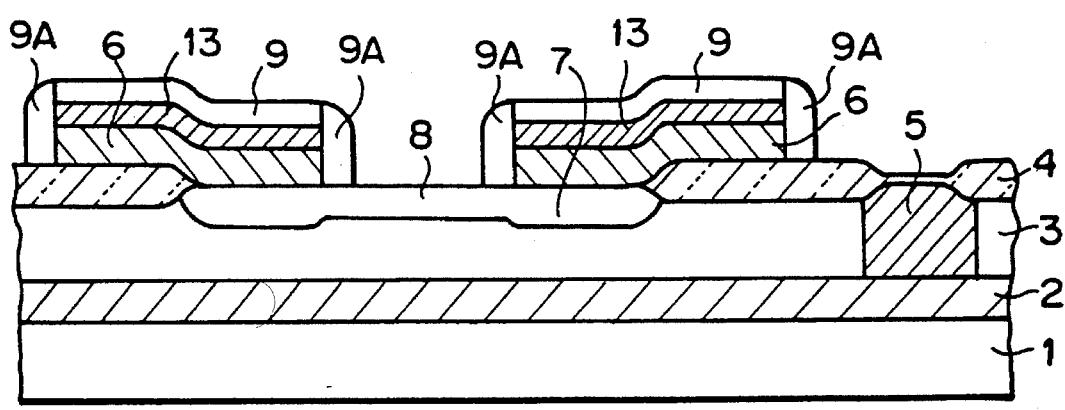

Next, as shown in FIG. 4B, after an oxide film on the active base area is removed by utilizing the photoetching process, a $P^+$-type polycrystalline silicon layer 6 containing boron having a thickness of 100 to 300 nm is grown. Introduction of boron into the polycrystalline silicon layer is conducted according to, for example, the ion implantation process under the condition of implantation energy of 5 to 10 keV, and $5 \times 10^{15}$ through $1 \times 10^{16}$ cm$^{-2}$. Incidentally, boron may be introduced while the polycrystalline silicon layer is being formed. Next, the metallic silicide layer, for example the tungsten silicide layer 13, is formed to a thickness of 100 to 200 nm by utilizing the sputtering process. Boron may be introduced into the tungsten silicide layer 13 by utilizing the ion implantation process. Next, the nitride film 9 is formed to a thickness of 100 to 200 nm by utilizing the LPCVD process. Next, the nitride film 9, tungsten silicide layer 13 and the polycrystalline silicon layer 6 are patterned to a predetermined form to form a base lead electrode. Next, boron is implanted into the active base area under the condition of 10 keV and $5 \times 10^{13}$ cm$^{-2}$ to form a base diffusion layer 8. Next, the sidewall 9A comprising a 100 to 300 nm thick silicon nitride film is formed on the lateral surface of the base lead electrode according to a known technique. As a result, the base lead electrode of tungsten polycide structure is covered over its upper and lateral surfaces with the silicon nitride film. Next, it is heat treated at the temperature of about 900 degrees Centigrade in the atmosphere of nitrogen for 10 to 20 min to recover the damage of the active base area caused by the ion implantation and to diffuse the boron contained in the polycrystalline silicon layer 6 into the N-type epitaxial layer 3. Thus, the external base diffusion layer 7 is formed.

Next, the $N^+$-type polycrystalline silicon layer 11 containing an N-type impurity, for example arsenic, is deposited to a thickness of 200 to 300 nm and patterned to form the emitter lead electrode. Next, it is heat treated at, the temperature of 900 to 950 degrees Centigrade in the atmosphere of nitrogen for 10 min to form the emitter diffusion layer 12. Thus, a structure of FIG. 3 is obtained. Thereafter, although not shown, an interlayer insulating film and electrodes are formed to complete a bipolar transistor.

Figure 1:
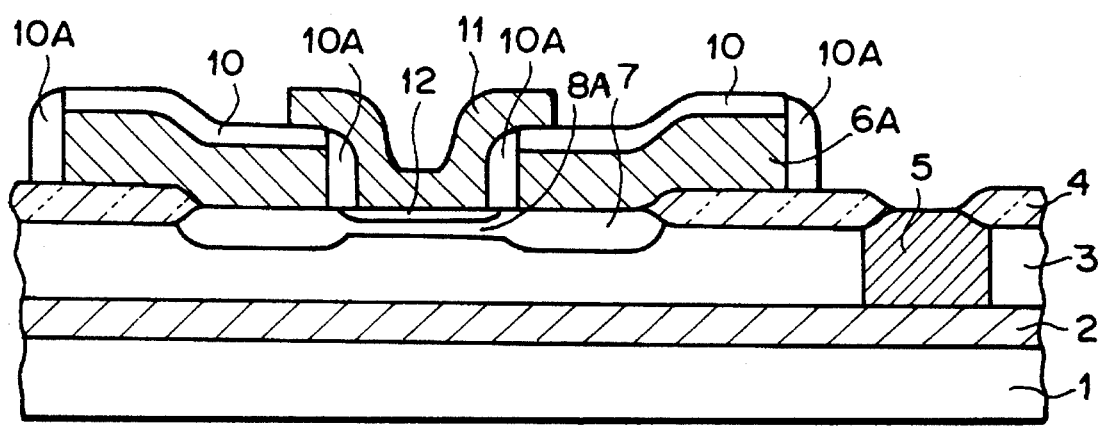
FIG. 1 is a cross-sectional view of a conventional semiconductor device.
Figure 2A:
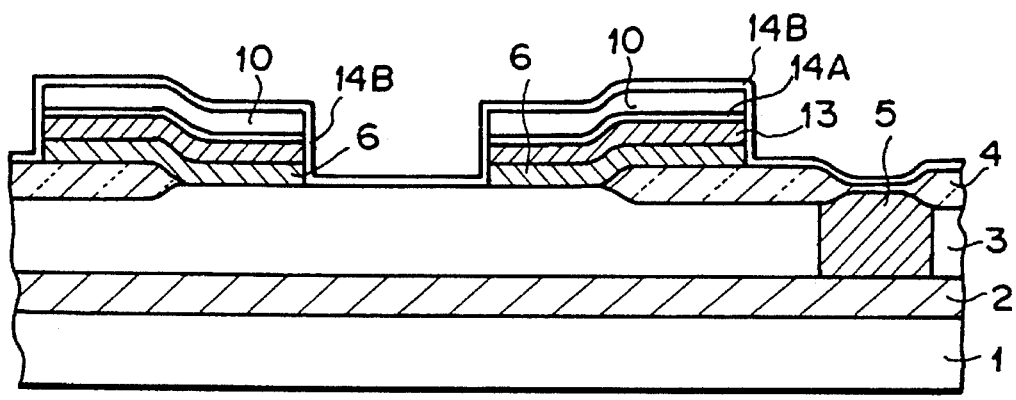
FIG. 2A through 2C are respectively a cross-sectional view of a semiconductor device for explaining a conventional method of manufacturing the same.
Figure 2B:
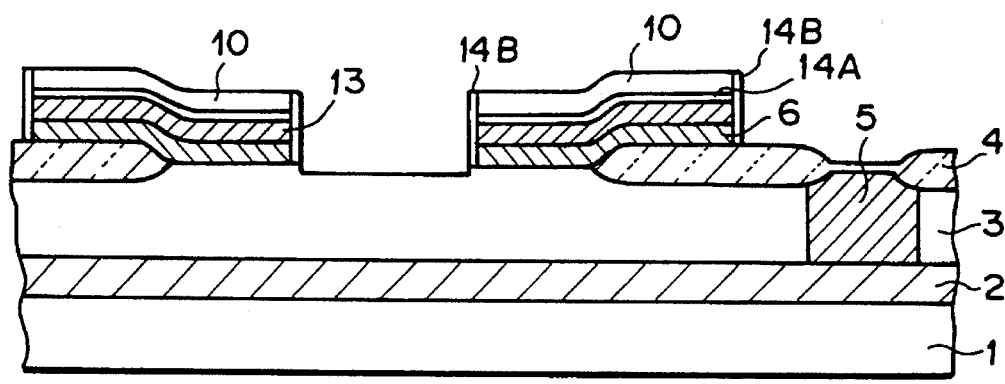
Figure 2C:
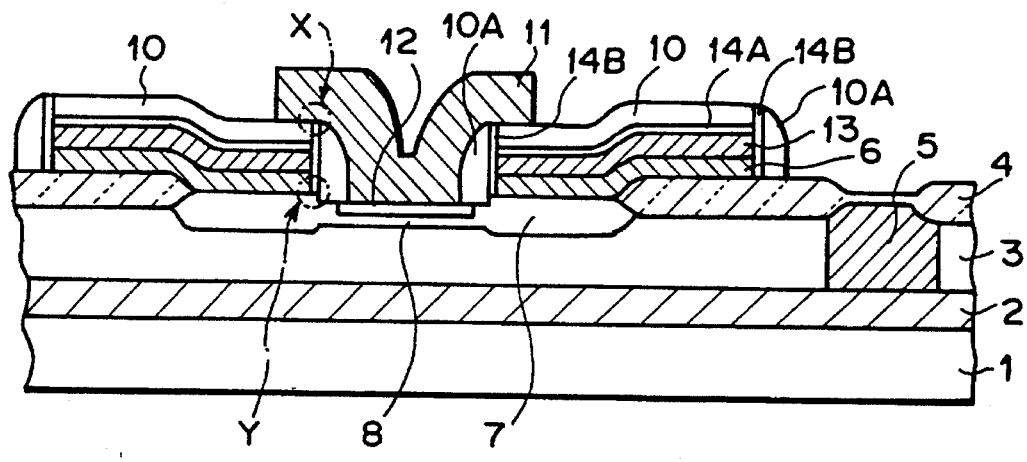
Figure 5:
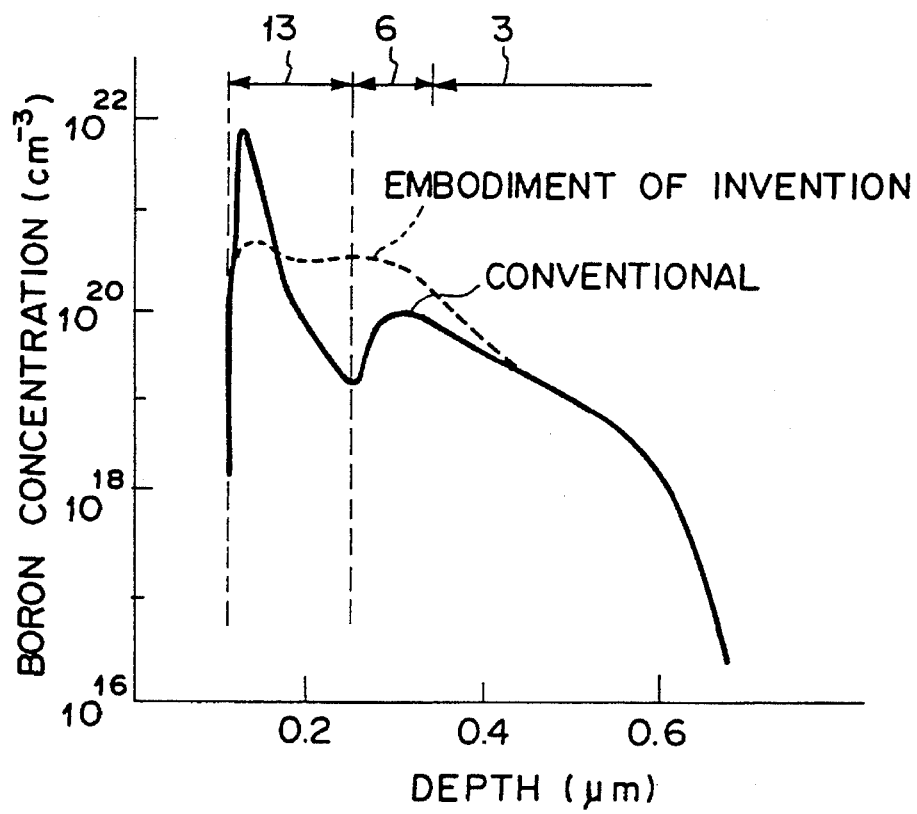
FIG. 5 is a graph illustrating a boron concentration distribution of the polycide electrode taken in the direction of depth in the semiconductor device according to the present invention and the conventional semiconductor device.

FIG. 5 is a graph illustrating a comparison of the boron concentration at the interface between the tungsten silicide layer 13 and the polycrystalline layer 6 between a structure of the first embodiment and a conventional structure of FIG. 2C in which the upper polycrystalline silicon layer 14A is not used. If the structure of the embodiment of the present invention in which the tungsten silicide layer 13 does not contact the oxide film is used, since the segregation of the boron does not occur, the boron concentration at the interface between the tungsten silicide layer 13 and the polycrystalline layer 6 can be maintained to about ten times as high as that of the conventional device, and the contact resistance can be made lower.

Figure 6:
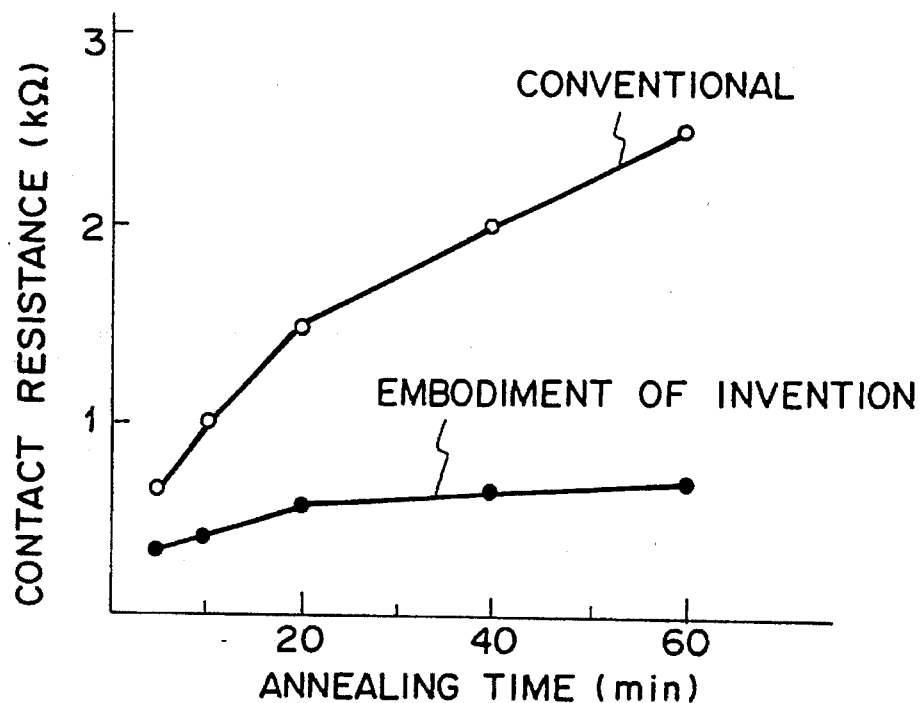
FIG. 6 is a graph illustrating a relationship between the annealing time and the contact resistance of a silicide layer/polycrystalline silicon layer in the semiconductor device according to the embodiment of the present invention and the conventional semiconductor device.

FIG. 6 illustrates a relationship between the annealing time and the contact resistance of the tungsten silicide layer 13 and the $P^+$-type polycrystalline silicon layer 6. In the embodiment of the present invention, it is found that the contact resistance can be made lower than that of the conventional device and that, even if the annealing time is made longer, the increase of the contact resistance can be made smaller.

Next, a second embodiment of the present invention is described. It differs from the first, embodiment of FIG. 3 in that the insulating film covering the upper portion of the polycide base electrode and the lateral surface of the electrode is covered with a nitride film containing boron (hereinafter referred to as SiBN film). Since the nitride film contains the boron, segregation of the boron at the interface between the SiBN film and the tungsten silicide layer can be further suppressed than with the first embodiment. As a result, the contact resistance of the interface between the tungsten silicide layer and the polycrystalline silicon layer can be maintained low, and a low base resistance equal to or lower than when the non-doped nitride film is used can be obtained. On the other hand, in order to improve the switching speed of the bipolar transistor, it is also important to reduce the parasitic capacitance. The dielectric constant of the SiBN film varies with the composition ratio of Si, B and N, and that of, for example, $Si_{0.1}B_{0.39}N_{0.51}$ is 3.6, which is smaller than 4 of the oxide film. Therefore, if the SiBN film is used for the insulating film and the sidewall on the base electrode of the tungsten polycide structure, then the capacitance between the emitter and the base can be reduced, and the charge/discharge time of this parasitic capacitance can also be shortened.

The SiBN film is formed, for example, with a total gas flow rate of 700 sccm, temperature of 350 degrees Centigrade and RF power density of 1 W/cm$^2$ by using a parallel plates type plasma CVD system and a mixture of $SiH_4$/$B_2H_6$/$NH_3$/Ar gases.

Figure 7:
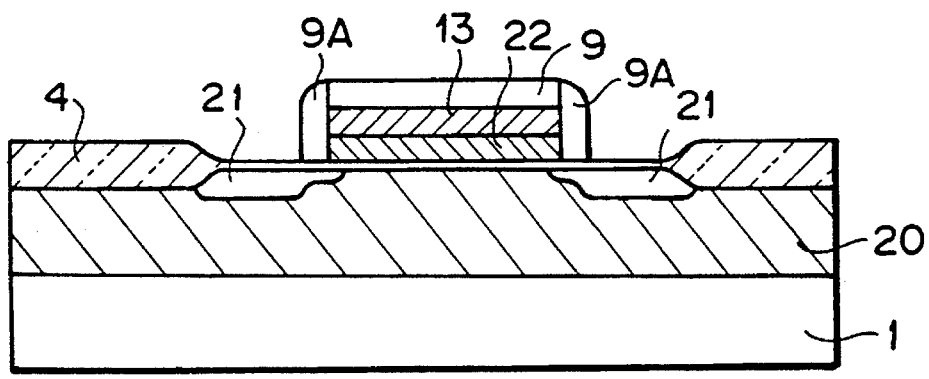
FIG. 7 is a cross-sectional view of a third embodiment of a semiconductor device according to the present invention.

Next, a third embodiment of the present invention applied to a P-type MOSFET is described with reference to FIG. 7. In FIG. 7, an N-type well 20, a P-type source/drain 21 and a field oxide film 4 are formed on a P-type silicon substrate 1, and a 100 to 200 nm thick gate electrode comprising a P-type polycrystalline silicon layer 22 and a tungsten silicide layer 13 is formed with a gate oxide film comprising a silicon oxide being interposed, and on the upper and lateral surfaces of the gate electrode, a 50 to 200 nm thick silicon nitride film 9 and a sidewall 9A made of silicon nitride film are formed respectively.

If, as described above, the silicide layer such as the tungsten silicide layer or the like which is covered with the oxide film is made to contact the polycrystalline silicon layer containing highly doped boron and is heat treated at a high temperature, then the boron within the polycrystalline silicon layer diffuses into the silicide layer, and the boron concentration within the polycrystalline silicon layer is reduced at the interface between the silicide layer and the polycrystalline silicon layer and the neighborhood thereof. In consequence, the contact between the silicide layer and the polycrystalline silicon layer results in a Schottky contact, and the contact resistance is increased. Further, at the gate electrode of the tungsten polycide structure, the boron concentration within the polycrystalline silicon layer is lowered due to the redistribution of boron, and if a channel of the transistor is turned on, the depletion layer extends also to the polycrystalline silicon layer side, and a so-called depletion of the gate takes place resulting in the reduction of the drain current.

Figure 8:
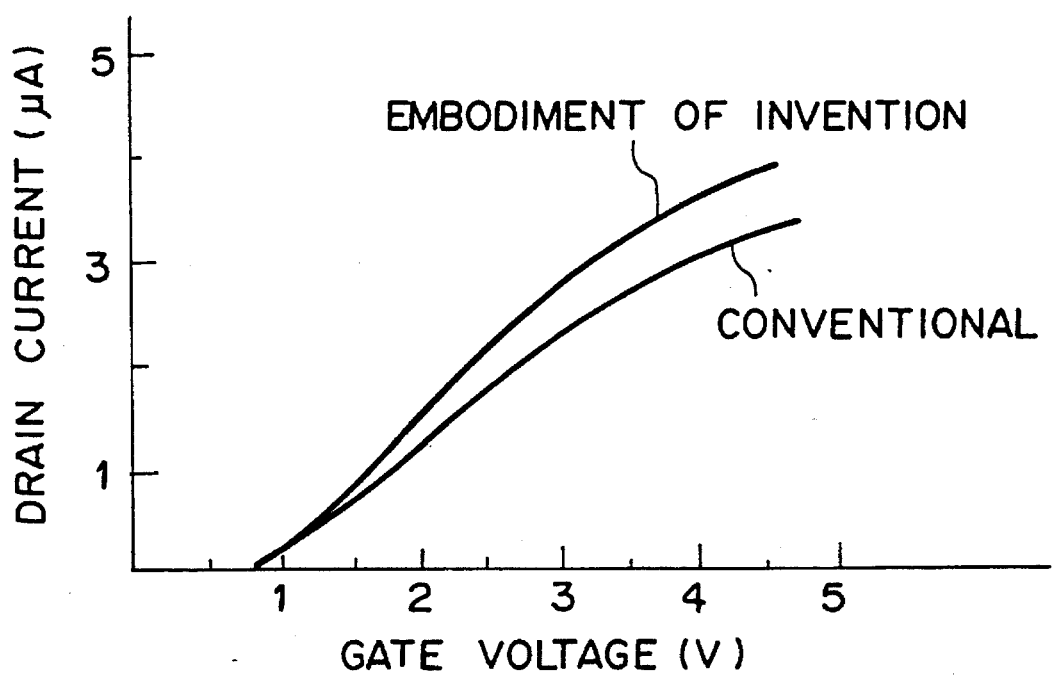
FIG. 8 is a graph illustrating a relationship between the gate voltage and the drain current for explaining the effect of the third embodiment of the present invention.

Therefore, as shown in FIG. 7, if the structure of the present invention is applied to the gate electrode of the polycide structure, then the depletion of the gate can be prevented and the reduction of the drain current can be eliminated. FIG. 8 illustrates a gate voltage-drain current characteristic of the P-type MOSFET which represents the foregoing effect.

Further, since the increase of the contact resistance of the interface between the tungsten silicide layer and the polycrystalline silicon layer can be prevented, the charge/discharge time of the gate input capacitance cain be shortened.

Although, in this third embodiment, only the P-type MOSFET was described, the present invention can also be applied to the N-type MOSFET.

In the present invention, the metallic silicide layer may be made of molybdenum silicide, titanium silicide, cobalt silicide, platinum silicide or tantalum silicide.

What is claimed is:

1. Semiconductor device having an electrically conductive layer comprising a polycrystalline silicon layer containing an impurity and a metallic silicide layer which are sequentially formed on a semiconductor substrate, and a silicon nitride film covering upper and lateral surfaces of said electrically conductive layer, said metallic silicide layer having an upper surface, a lower surface and a lateral surface, said polycrystalline silicon layer having a lateral surface and an upper surface in contact with said lower surface of said metallic silicide layer, wherein said upper surface of said metallic silicide layer, said lateral surface of said metallic silicide layer and said lateral surface of said polycrystalline silicon layer are in contact with said silicon nitride film.

2. Semiconductor device as set forth in claim 1, wherein said silicon nitride film contains a same impurity as that of said polycrystalline silicon layer.

3. Semiconductor device as set forth in claim 1, wherein said metallic silicide layer contains the same impurity as that of said polycrystalline silicon layer.

4. Semiconductor device as set forth in claim 1, wherein said semiconductor substrate is made of silicon.

5. Semiconductor device as set forth in claim 1, wherein said impurity is boron.

6. Semiconductor device as set forth in claim 1, wherein said metallic silicide layer is made of a material selected from the group consisting of tungsten silicide, molybdenum silicide, titanium silicide, cobalt silicide, platinum silicide and tantalum silicide.

7. Semiconductor device as set forth in claim 1, wherein said electrically conductive layer is a base lead electrode of a bipolar transistor.

8. Semiconductor device having an electrically conductive layer comprising a polycrystalline silicon layer containing an impurity and a metallic silicide layer which are sequentially formed on an insulating film formed on a semiconductor substrate, and a silicon nitride film covering upper and lateral surfaces of said electrically conductive layer, said metallic silicide layer having an upper surface, a lower surface and a lateral surface, said polycrystalline silicon layer having a lateral surface and an upper surface in contact with said lower surface of said metallic silicide layer, wherein said upper surface of said metallic silicide layer, said lateral surface of said metallic silicide layer and said lateral surface of said polycrystalline silicon layer are in contact with said silicon nitride film.

9. Semiconductor device as set forth in claim 8, wherein said silicon nitride film contains a same impurity as that of said polycrystalline silicon layer.

10. Semiconductor device as set forth in claim 8, wherein said metallic silicide layer contains the same impurity as that of said polycrystalline silicon layer.

11. Semiconductor device as set forth in claim 8, wherein said semiconductor substrate is made of silicon.

12. Semiconductor device as set forth in claim 8, wherein said insulating film is made of silicon oxide.

13. Semiconductor device as set forth in claim 8, wherein said impurity is boron.

14. Semiconductor device as set forth in claim 8, wherein said metallic silicide layer is made of a material selected from the group consisting of tungsten silicide, molybdenum silicide, titanium silicide, cobalt silicide, platinum silicide, and tantalum silicide.

15. Semiconductor device as set forth in claim 8, wherein said electrically conductive layer is a gate electrode of a MOSFET.

* * * * *